United States Patent [19]

Endo

[11] Patent Number: 5,422,515
[45] Date of Patent: Jun. 6, 1995

[54] SEMICONDUCTOR MODULE INCLUDING WIRING STRUCTURES EACH HAVING DIFFERENT CURRENT CAPACITY

[75] Inventor: Koichi Endo, Tokyo, Japan

[73] Assignee: Kabushiki Kaisha Toshiba, Kawasaki, Japan

[21] Appl. No.: 34,868

[22] Filed: Mar. 19, 1993

[30] Foreign Application Priority Data

Apr. 14, 1992 [JP] Japan .................................. 4-094267

[51] Int. Cl.$^6$ ............................................. H01L 23/48
[52] U.S. Cl. ................................... 257/691; 257/685; 257/700
[58] Field of Search ............... 257/784, 685, 691, 700, 257/774

[56] References Cited

U.S. PATENT DOCUMENTS

| 4,677,528 | 6/1987 | Miniet | 361/398 |
| 4,783,695 | 11/1988 | Eichelberger | 257/700 |
| 5,274,270 | 12/1993 | Tuckerman | 257/758 |

FOREIGN PATENT DOCUMENTS 498446 8/1992 European Pat. Off. .

Primary Examiner—Rolf Hille
Assistant Examiner—Roy Potter
Attorney, Agent, or Firm—Oblon, Spivak, McClelland, Maier, & Neustadt

[57] ABSTRACT

A semiconductor module having good heat dissipation and large current density includes an insulating substrate having a first group of wiring layers, a plurality of electronic components such as IC chips mounted on the insulating substrate and having bonding pads, an insulating sheet provided above the electronic components to cover the electronic components and having a second group of wiring layers, and a plurality of apertures formed in the insulating sheet and electrically connecting the first and second groups of wiring layers and the bonding pads to one another. The first group of wiring layers has a larger current capacity than the second group of wiring layers.

7 Claims, 5 Drawing Sheets

SEMICONDUCTOR MODULE INCLUDING WIRING STRUCTURES EACH HAVING DIFFERENT CURRENT CAPACITY

BACKGROUND OF THE INVENTION

1. Field of the Invention

The present invention relates to an encapsulated semiconductor module which includes electronic components such as IC chips.

2. Description of the Related Art

FIG. 7 is a plan view showing a conventional semiconductor module. A large number of wiring layers of a metal thin film are provided on a flexible film 73, and two IC chips 75 having bumps (not shown) of solder or gold are mounted on the wiring layers 74.

FIG. 8 is a sectional view showing the connection between the IC chip and the wiring layers by means of TAP (Tape Automated Bonding). That is, the IC chip 75 is electrically connected to the wiring layers 74 through bumps 76, and the wiring layers 74 are electrically connected to external leads (not shown).

Since each of the wiring layers 74 used for the TAB is thin, the current capacity thereof is small. However, since a relatively large current is required for the semiconductor module, the current capacity may be reduced. In addition, since the IC chips 75 are only compression-bonded to the wiring layers 74 through the bumps, the contact areas of the IC chips 75 to the flexible film 73 become small. For this reason, each of the IC chips 75 has poor heat dissipation.

FIG. 9 is a plan view showing another conventional semiconductor module. This support member includes a plurality of leads 70 made of a metal plate, and islands 71 unitary with the leads 70. An IC chip 78 and circuit components 72 such as power MOS devices and other discrete semiconductor devices are mounted on the islands 71, respectively. A part of each of the leads 70, the circuit components 72, and the IC chip 78 are molded with a plastic material PC.

The support member is formed of a metal, e.g., copper, provided by etching or punching. The IC chip 78 and the circuit components 72 are electrically connected to the leads 70 through bonding wires 79.

However, in the above semiconductor module, the structure is complicated when the number of chips is increased.

FIG. 10 is a plan view showing still another conventional semiconductor module. Provided on a support substrate 80 are wiring layers 81 of copper, chip type electronic components 82 such as capacitor, resistor, etc., a printed resistor 83 whose resistance value is finely adjusted by trimming, and IC chips 84 mounted on the support substrate 80. The IC chips 84 are electrically connected to the wiring layers 81 by bonding wires 85, and the wiring layers 81 are electrically connected to leads (not shown).

The support substrate 80 is formed of an insulating plate or a plate having a surface subjected to insulation treatment. For carrying out the insulation treatment, an insulating film is adhered to the plate, or the plate is coated with an insulating coating. The wiring layers 81 are formed by bonding a metal plate on the support substrate 80 and etching it, by bonding an etched frame on the support substrate 80, or by printing a conductive resin paste on the support substrate 80.

Even in the above semiconductor module, since the thick wiring layers 81 are formed on the support substrate 80, the occupying area of the wiring layers 81 is increased. In addition, the wiring layers 81 are complicated as the number of chips is increased. For this reason, the occupying area of the wiring layers 81 is larger than that of the chips, thereby increasing an area per one chip in the semiconductor module. That is, the area efficiency is degraded.

In any case, in each of the above conventional semiconductor modules, since the thick wiring layers are provided on the substrate, the occupying area of the wiring layers is increased. In the case of the wiring structure connected by TAB, the current capacity is low, and the contact area between the substrate and the IC chip is small. For this reason, the IC chip has poor heat dissipation.

SUMMARY OF THE INVENTION

It is, therefore, an object of the present invention to provide a semiconductor module, such as an encapsulated semiconductor device, including a wiring structure having good heat dissipation and a large current capacity.

It is another object of the present invention to provide a semiconductor module, such as an encapsulated semiconductor device, having a large number of chips and a small wiring area.

According to one aspect of the present invention, there is provided a semiconductor module, which comprises an insulating substrate having a first group of wiring layers, a plurality of electronic components mounted on the insulating substrate and having bonding pads, an insulating sheet provided above the insulating substrate to cover the electronic components and having a second group of wiring layers, and a plurality of apertures, formed through the insulating sheet, for electrically connecting the first and second groups of wiring layers and the bonding pads to one another. In this case, the first group of wiring layers has a larger current capacity than the second group of wiring layers.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

DETAILED DESCRIPTION OF THE PREFERRED EMBODIMENTS

Figure 1A:
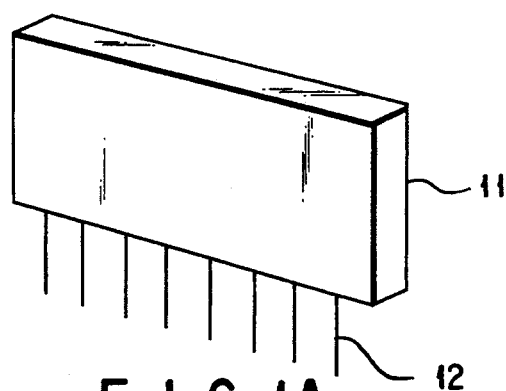
FIGS. 1A and 1B are perspective views showing an encapsulated semiconductor module according to a first embodiment of the present invention.

Embodiments of the present invention will be described below with reference to the accompanying drawings. Note that the same reference numerals denote the same parts.

Figure 1B:
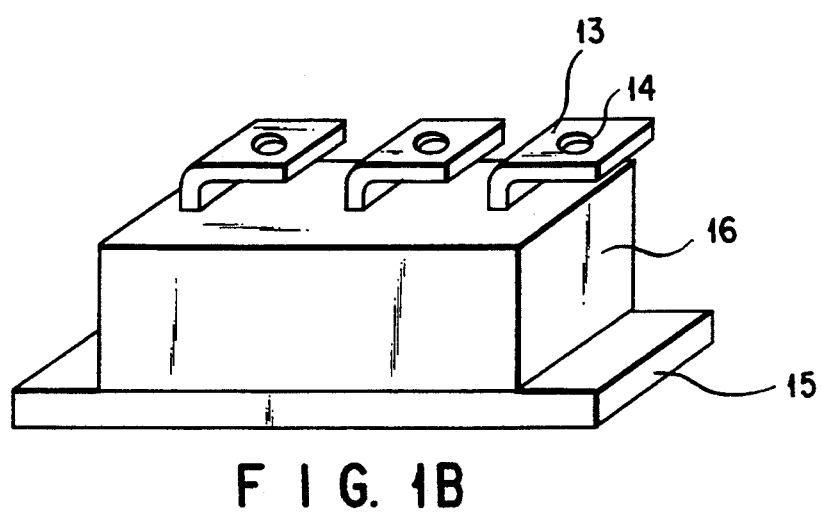

FIGS. 1A and 1B are perspective views respectively showing an encapsulated SIP (Single In-line Package) and an encapsulated semiconductor module according to a first embodiment of the present invention. In FIG. 1A, a semiconductor module (not shown) is encapsulated by a resin layer 11, and leads 12 electrically connected to the semiconductor module are projected from the resin layer 11. In FIG. 1B, the semiconductor module includes a plurality of reverse L-shaped terminals 13 each having a fixing hole 14. After a support substrate for the semiconductor module is mounted on a heat sink 15, the semiconductor module is encapsulated by a resin layer 16.

Figure 2:
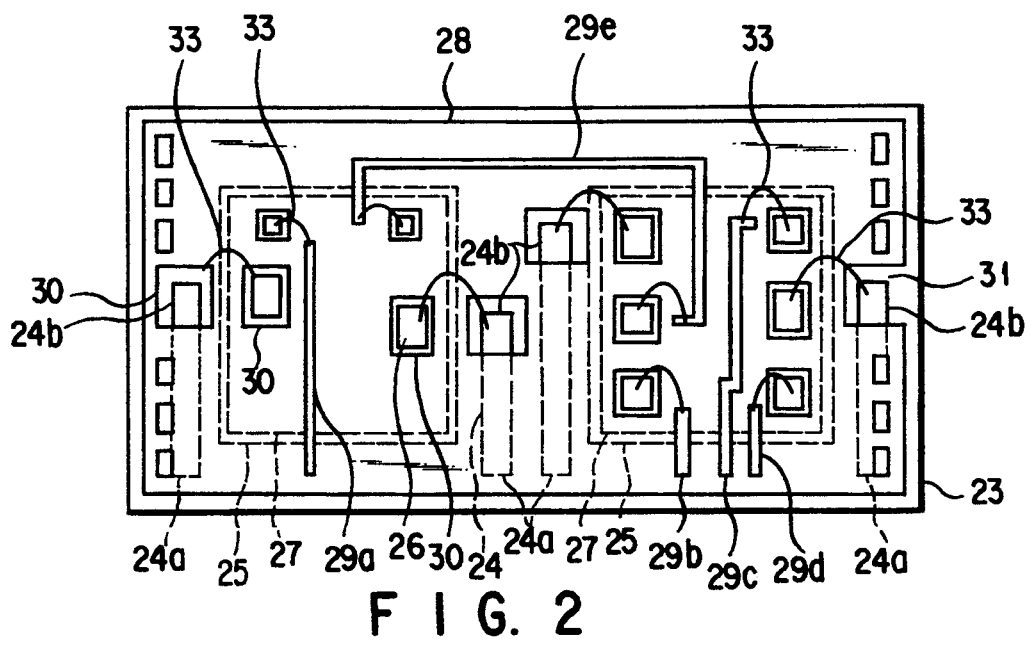
FIG. 2 is a plan view showing the semiconductor module according to the first embodiment of the present invention.

FIG. 2 is a plan view showing the internal structure of FIG. 1A or 1B. The semiconductor module comprises an insulating substrate 23 shown in FIG. 3, IC chips 27 mounted on the substrate 23 and shown in FIGS. 4A and 4B, and a flexible film 28 covering the IC chips 27 and shown in FIG. 5.

Figure 3:
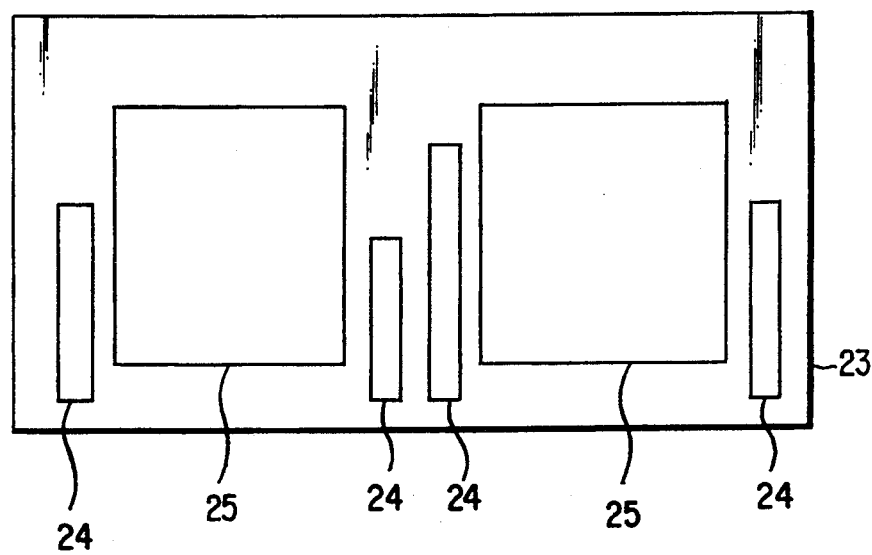
FIG. 3 is an view showing an insulating substrate in the semiconductor module shown in FIG. 2.
Figures 4A, 4B:
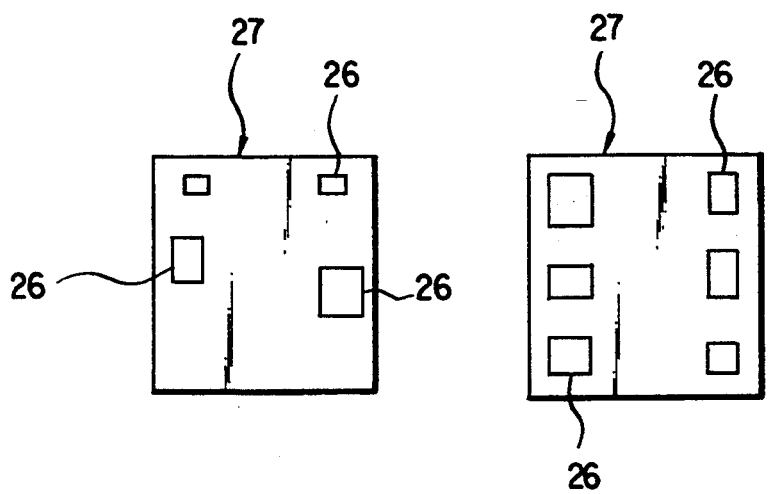
FIGS. 4A and 4B are plan views respectively showing IC chips in the semiconductor module shown in FIG. 2.
Figure 5:
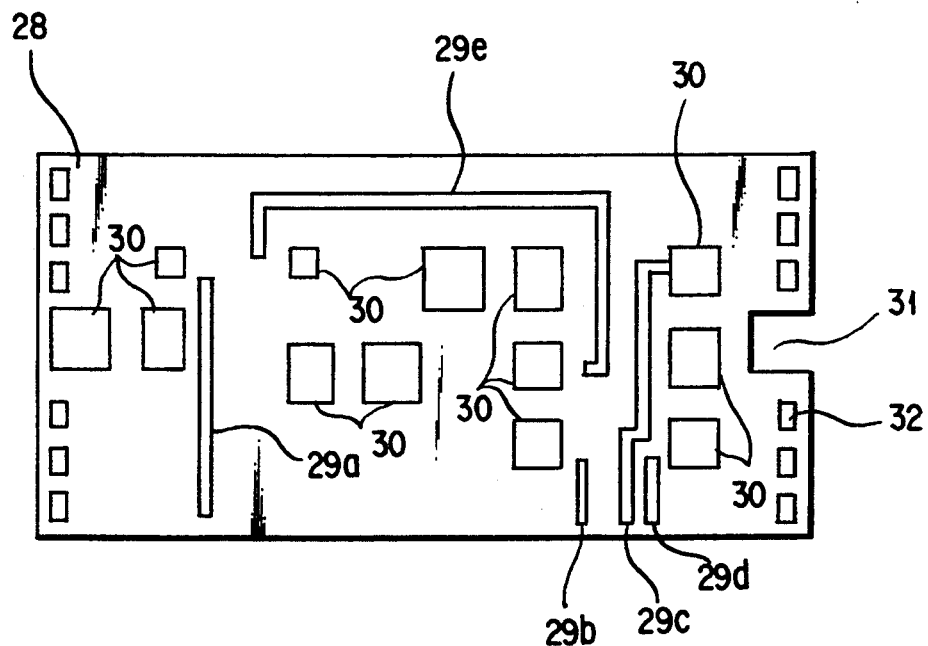
FIG. 5 is a plan view showing a flexible film in the semiconductor module shown in FIG. 2.

As shown in FIG. 3, the substrate 23 includes power supply wiring layers 24 through which a large current flows, and mount beds 25 for mounting IC chips. The IC chips 27 each having bonding pads shown in FIGS. 4A and 4B are mounted on the mount beds 25, respectively. The flexible film 28 shown in FIG. 5 is adhered to the IC chips 27 by an adhesive or a paste (not shown), and a plurality of small current wiring layers 29a to 29e are provided on the flexible film 28. The flexible film 28 also includes a plurality of apertures 30, a notched portion 31, and sprocket holes 32. The apertures 30 and the notched portion 31 are located at positions corresponding to the contact ends of the bonding pads 26 and the power supply wiring layers 24. The sprocket holes 32 are formed in the flexible film 28 at both sides thereof. In making the semiconductor module, the sprocket holes 32 are used to align the flexible film 28 with the IC chips 27.

The bonding pads 26, the power supply wiring layers 24, and the small current wiring layers 29a to 29e are electrically connected to one another through bonding wires 33 as shown in FIG. 2.

That is, after the IC chips 27 are respectively mounted on the mount beds 25 of the substrate 23, the flexible film 28 is adhered to the IC chips 27 in such a manner that the bonding pads 26 and parts of the power supply wiring layers 24 are exposed from the apertures 30 and the notched portion 31. One end 24a of each of the power supply wiring layers 24 and one end of each of the small current wiring layers 29a to 29e may be connected to, e.g., the leads 12 or 13.

On the other hand, the other end 24b of each of the power supply wiring layers 24 exposed from the apertures 31 is connected to the predetermined bonding pad 26 exposed from the corresponding aperture 30. The other end of each of the small current wiring layers 29a to 29d is connected to the predetermined bonding pad 26 exposed from the corresponding aperture 30. In addition, both ends of the small current wiring layer 29e are connected to desired bonding pads 26.

Figure 6:
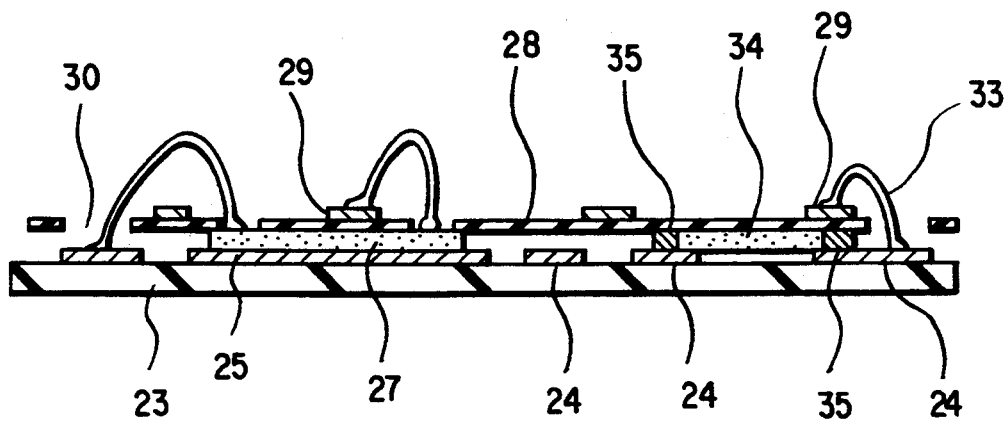
FIG. 6 sectional view showing a semiconductor module, having a chip type circuit component such as resistors, according to a second embodiment of the present invention.
Figure 7:
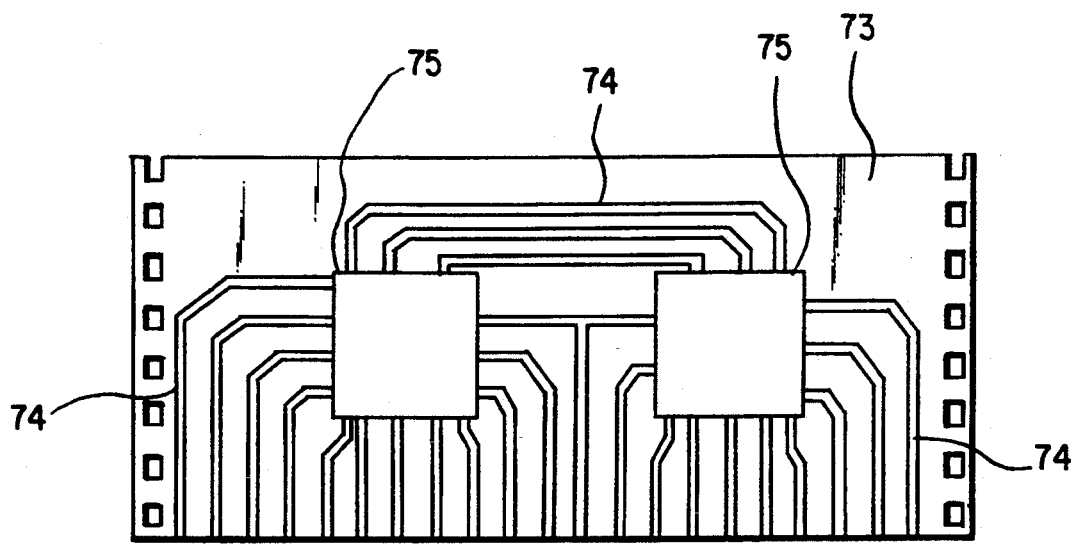
FIG. 7 is a plan view showing a conventional semiconductor module.
Figure 8:
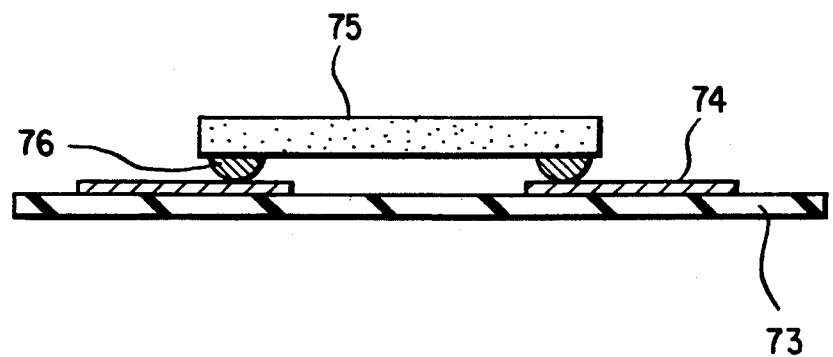
FIG. 8 is a sectional view showing the conventional connection between an IC chip and wiring layers by TAB.
Figure 9:
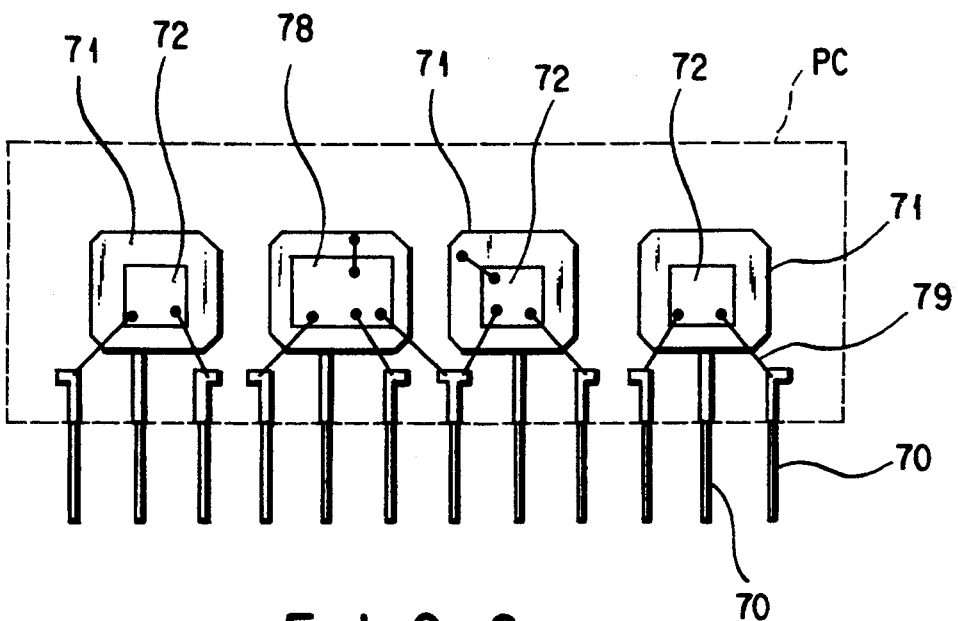
FIG. 9 is a plan view showing another conventional semiconductor module.
Figure 10:
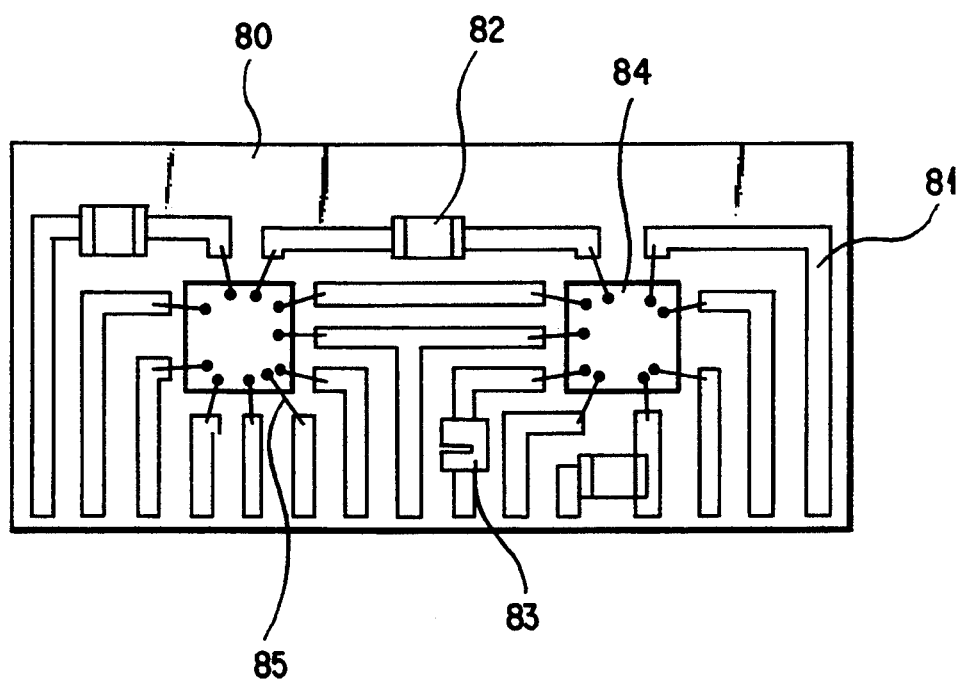
FIG. 10 is a plan view showing still another conventional semiconductor module.

FIG. 6 shows a second embodiment of the present invention, and is a sectional view showing a semiconductor module having a circuit component such as chip type resistors. Power supply wiring layers 24 are provided on the insulating substrate 23, and the IC chip 27 and a circuit component 34 such as a resistor or capacitor having electrodes 35 at both ends are fixed on the substrate 23 through a solder or paste (not shown). The flexible film 28 having the apertures 30 is adhered over the IC chip 27 and the circuit components 34, and the small current wiring layers 29 are formed on the flexible film 28.

Since no bonding pads are provided on the circuit component 34, it is electrically connected to the power supply wiring layers 24 through the electrodes 35, and the power supply wiring layers 24 are electrically connected to the small current wiring layers 29 through bonding wires 33.

In any case, according to the embodiments, the power supply wiring layers 24 are provided on the substrate 23, on which the IC chip 27 is mounted. The small current wiring layers 29a to 29e are further provided on the flexible film 28. Therefore, it can be possible to render the current capacity sufficiently larger than that of the small current wiring layers to the power supply wiring layers. In addition, the small current wiring layers 29a to 29e can be provided without considering unwanted connections of the IC chip 27 and power supply wiring layers 24 thereto, and the occupying area of the small current wiring layers 29a to 29e can be decreased. Therefore, even if the number of the IC chips 27 is increased, the area required to provide only the IC chips 27 and power supply wiring layers 24 can be decreased to reduce the size of the substrate 23.

In addition, the flexible film 28 has the apertures 30 and the notched portion 31. Therefore, when the flexible film 28 is adhered to the IC chips 27, the contact ends of the power supply wiring layers 24, formed on the substrate 23, and bonding pads 26 of the IC chips 27 are exposed from the apertures 30. Accordingly, the exposed contact ends of the power supply wiring layers 24 can be electrically connected to the bonding pads 26, and the small current wiring layers 29a to 29e formed on the flexible film 28 can be also connected to the bonding pads 26.

Further, the IC chips and the circuit components such as resistors are mounted on the substrate 23. Therefore, since the semiconductor module according to the embodiments has a larger contact area of each component to the substrate than that of the prior art semiconductor module using TAB, good heat dissipation can be obtained.

However, for making the semiconductor module, since bonding at the contact ends of the small current wiring layers 29a to 29e is carried out on the IC chip 27, the IC chip 27 may be subjected to unwanted shock during the bonding. In order to protect the IC chip 27 from the shock, the following techniques may be employed.

(1) The flexible film 28 is bonded by an elastic adhesive or paste.

(2) A shock resisting film is used as a passivation film for the IC chip 27.

(3) A shock resisting film is used as the flexible film 28 having the small current wiring layers 29a to 29e.

Note that, when no electronic component such as an IC chip is present under the bonding portions of the small current wiring layers, bonding can be performed after a support member such as a ceramic plate is arranged on the insulating substrate.

In addition, the semiconductor module of the present invention is not limited to the above embodiments, and an electronic component such as logic control ICs can be mounted on the flexible film by means of the conventional mounting technique, e.g., TAB.

As has been described above, according to the present invention, first wiring layers having a large current capacity are provided on an insulating substrate together with an IC chip, while second wiring layers having a small current capacity are formed on an insulating sheet. For this reason, the second wiring layers can be formed without considering unwanted contact or connection among the IC chip and the first wiring layers. Therefore, the occupying area of the second wiring layers can be decreased. In addition, since the contact ends of the first wiring layers and the IC chip formed on the insulating substrate are exposed by forming apertures in the insulating sheet, the exposed portions of the first wiring layers can be electrically connected to the bonding pads of the IC chip, and the bonding pads of the IC chip can be connected to the second wiring layers formed on the insulating sheet. Therefore, a semiconductor module having good heat dissipation can be obtained to provide a wiring structure having a large current capacity.

What is claimed is:

1. A semiconductor module comprising:
    an insulating substrate including first wiring layers each having a first current capacity;
    a plurality of electronic components mounted on said insulating substrate, each of said plurality of electronic components having bonding pads; and
    an insulating layer comprised of a flexible film, including second wiring layers, each having a second current capacity smaller than said first current capacity, and a plurality of openings, said insulating layer being disposed above said insulating substrate such that said bonding pads and said first wiring layers are exposed through said openings to electrically connect said first and second wiring layers and said bonding pads to one another.

2. The semiconductor module according to claim 1, wherein said first wiring layers function as power supply lines.

3. The semiconductor module according to claim 1, wherein said second wiring layers function as signal lines.

4. The semiconductor module according to claim 1, wherein each of said bonding pads is electrically connected to ends of said first and second wiring layers via bonding wires.

5. The semiconductor module according to claim 1, wherein said plurality of electronic components is comprised of integrated circuit chips.

6. The semiconductor module according to claim 1, wherein said plurality of electronic components includes a combination of integrated circuit chips, power MOS devices, chip type resistors, and chip type capacitors.

7. The semiconductor module according to claim 1, wherein said plurality of electronic components are directly mounted on said insulating substrate or said first wiring layers.

* * * * *